(12) United States Patent
Adkisson et al.

(10) Patent No.: US 7,723,178 B2
(45) Date of Patent: May 25, 2010

(54) SHALLOW AND DEEP TRENCH ISOLATION STRUCTURES IN SEMICONDUCTOR INTEGRATED CIRCUITS

(75) Inventors: James William Adkisson, Jericho, VT (US); Andres Bryant, Burlington, VT (US); Anthony Kendall Stamper, Williston, VT (US); Mickey H. Yu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/175,474

(22) Filed: Jul. 18, 2008

(65) Prior Publication Data

US 2010/0015765 A1     Jan. 21, 2010

(51) Int. Cl.
*H01L 21/8238* (2006.01)

(52) U.S. Cl. .................. 438/221; 438/294; 438/262; 438/401; 257/347; 257/E21.206; 257/E21.564

(58) Field of Classification Search .................. 438/221, 438/437, 778, 294, 262; 257/903, 510, 347, 257/E21.206, E21.564
See application file for complete search history.

(56) References Cited

U.S. PATENT DOCUMENTS

| | | | |
|---|---|---|---|
| 4,994,406 A | 2/1991 | Vasquez et al. | |
| 5,930,107 A | 7/1999 | Rajeevakumar | |
| 6,197,661 B1 * | 3/2001 | Mogami et al. | 438/437 |
| 6,232,202 B1 | 5/2001 | Hong | |
| 6,297,127 B1 | 10/2001 | Chen et al. | |
| 6,372,600 B1 | 4/2002 | Desko et al. | |
| 6,521,947 B1 * | 2/2003 | Ajmera et al. | 257/347 |
| 6,833,602 B1 | 12/2004 | Mehta | |
| 6,864,151 B2 | 3/2005 | Yan et al. | |
| 6,982,230 B2 * | 1/2006 | Cabral et al. | 438/778 |
| 7,009,237 B2 | 3/2006 | Adkisson et al. | |
| 7,019,348 B2 | 3/2006 | Tu | |
| 7,071,075 B2 | 7/2006 | Hao et al. | |
| 7,332,405 B2 * | 2/2008 | Yabe et al. | 438/401 |
| 2005/0017377 A1 * | 1/2005 | Joshi et al. | 257/903 |
| 2007/0040235 A1 * | 2/2007 | Chan et al. | 257/510 |

* cited by examiner

*Primary Examiner*—Matthew Smith
*Assistant Examiner*—Wilner Jean Baptiste
(74) *Attorney, Agent, or Firm*—Schmeiser, Olsen & Watts; Richard M. Kotulak (57) ABSTRACT

A semiconductor structure fabrication method. The method includes providing a semiconductor structure which includes a first semiconductor layer and a dielectric bottom portion in the first semiconductor layer. A second semiconductor layer on the first semiconductor layer is formed. The first and second semiconductor layers include a semiconductor material. A dielectric top portion and a first STI (Shallow Trench Isolation) region are formed in the second semiconductor layer. The dielectric top portion is in direct physical contact with the dielectric bottom portion.

20 Claims, 7 Drawing Sheets

SHALLOW AND DEEP TRENCH ISOLATION STRUCTURES IN SEMICONDUCTOR INTEGRATED CIRCUITS

FIELD OF THE INVENTION

The present invention relates generally to trench isolation structures and more particularly to shallow and deep trench isolation structures formed in the same semiconductor integrated circuit.

BACKGROUND OF THE INVENTION

In a conventional integrated circuit which includes NFETs (N-channel field effect transistors) and PFETs, shallow trench isolation regions are usually formed to electrically isolate the NFETs from one another and to electrically isolate the PFETs from one another. These same shallow trench isolation regions, in combination with well doping, also electrically isolate the NFETs and the PFETs. As the spacing requirements of integrated circuits become more exacting, formation of deep wells perfectly aligned with the very narrow shallow trench isolation becomes impractical. Therefore, there is a need for a method for forming deep trench and shallow trench isolation regions in the integrated circuit.

SUMMARY OF THE INVENTION

The present invention provides a semiconductor structure fabrication method, comprising providing a semiconductor structure which includes a first semiconductor layer and a dielectric bottom portion in the first semiconductor layer, wherein the first semiconductor layer comprises a semiconductor material; forming a second semiconductor layer on the first semiconductor layer, wherein the second semiconductor layer comprises the semiconductor material; and after said forming the second semiconductor layer is performed, forming a dielectric top portion and a first STI (Shallow Trench Isolation) region in the second semiconductor layer, wherein the dielectric top portion is in direct physical contact with the dielectric bottom portion.

The present invention provides a method for forming deep trench and shallow trench isolation regions in the integrated circuit.

DETAILED DESCRIPTION OF THE INVENTION

FIGS. 1A-1I show cross-section views that illustrate a fabrication process of a semiconductor structure 100, in accordance with embodiments of the present invention. More specifically, with reference to FIG. 1A, the fabrication process of the semiconductor structure 100 can start with a substrate 110. The substrate 110 can comprise silicon.

Next, in one embodiment, alignment mark regions 112 and dielectric regions 114a and 114b are formed in the substrate 110. The widths 114a' and 114b' of the dielectric regions 114a and 114b, respectively, can be around 50 nm. The alignment mark regions 112 and the dielectric regions 114a and 114b can comprise a dielectric material such as silicon dioxide. The alignment mark regions 112 and the dielectric regions 114a and 114b can be formed by (i) creating trenches 112, 114a, and 114b and then (ii) filling the trenches 112, 114a, and 114b with silicon dioxide resulting in the alignment mark regions 112 and the dielectric regions 114a and 114b of FIG. 1A. More specifically, the trenches 112, 114a, and 114b can be created by selectively etching the substrate 110 in a direction defined by an arrow 111 (hereafter can be referred to as the direction 111). The direction 111 is perpendicular to the top surface 110' of the substrate 110.

Figure 1A:
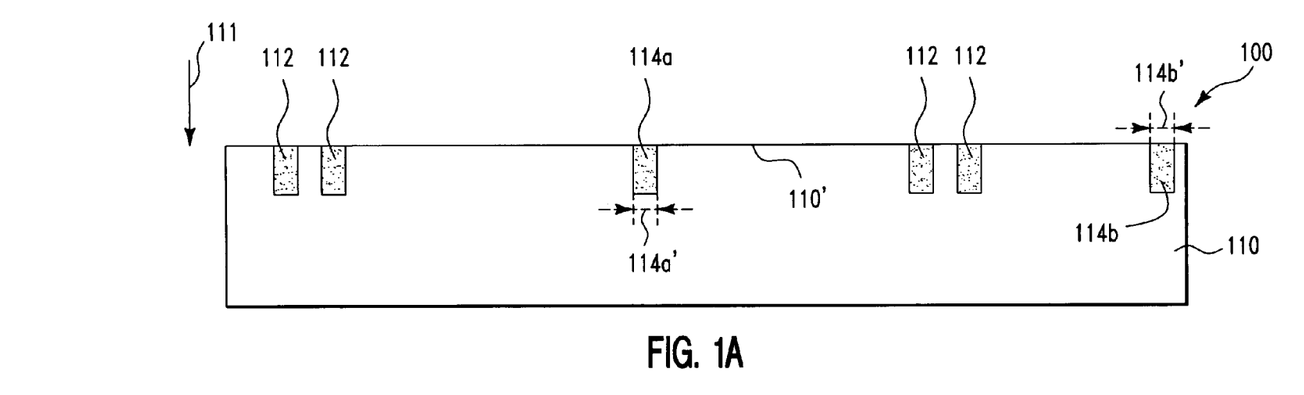
FIG. 1A shows a cross-section view of a fabrication process of a semiconductor structure, in accordance with embodiments of the present invention.
Figure 1B:
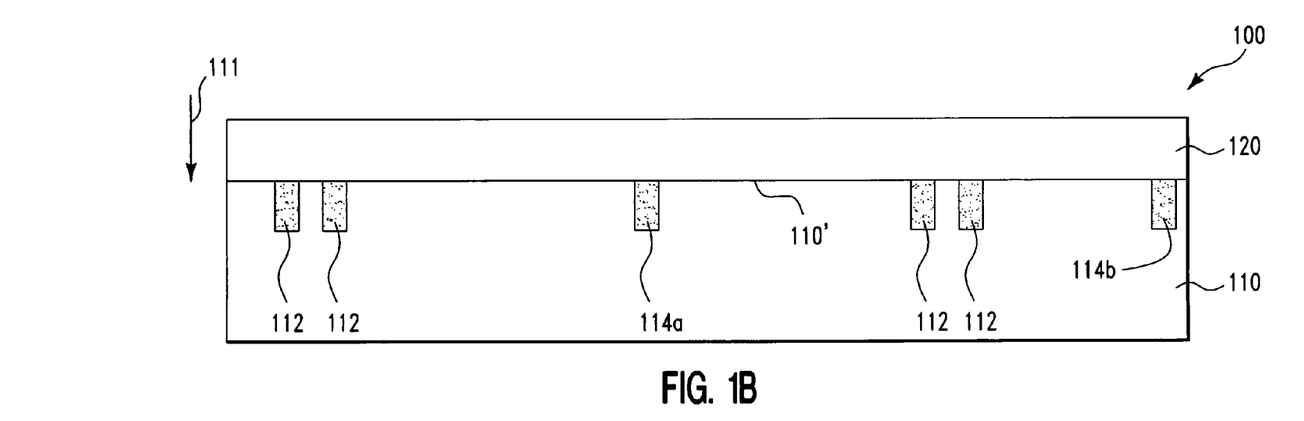
FIG. 1B shows a cross-section view of a semiconductor structure resulting from forming a semiconductor layer on the structure of FIG. 1A, in accordance with embodiments of the present invention.

Next, with reference to FIG. 1B, in one embodiment, a semiconductor layer 120 is formed on top of the substrate 110. The semiconductor layer 120 can comprise silicon. The semiconductor layer 120 can be formed by a conventional Smart-Cut® process. The semiconductor layer 120 and the substrate 110 can be collectively referred to as semiconductor substrate 110+120.

Figure 1C:
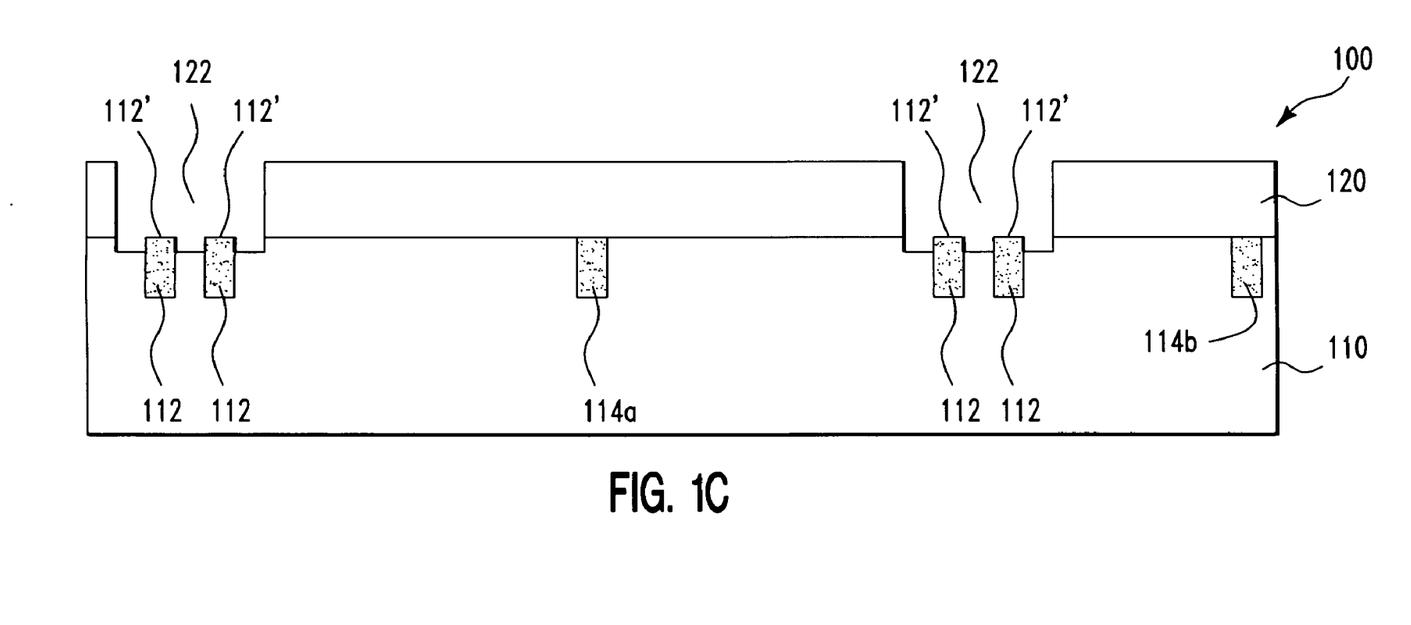
FIG. 1C shows a cross-section view of a semiconductor structure resulting from creating trenches in the structure of FIG. 1B, in accordance with embodiments of the present invention.

Next, with reference to FIG. 1C, in one embodiment, trenches 122 are created in the semiconductor layer 120 and the substrate 110 such that the top surfaces 112' of the alignment mark regions 112 are exposed to the surrounding ambient through the trenches 122. More specifically, the trenches 122 of the semiconductor layer 120 can be created by conventional lithographic and etching processes.

Figure 1D:
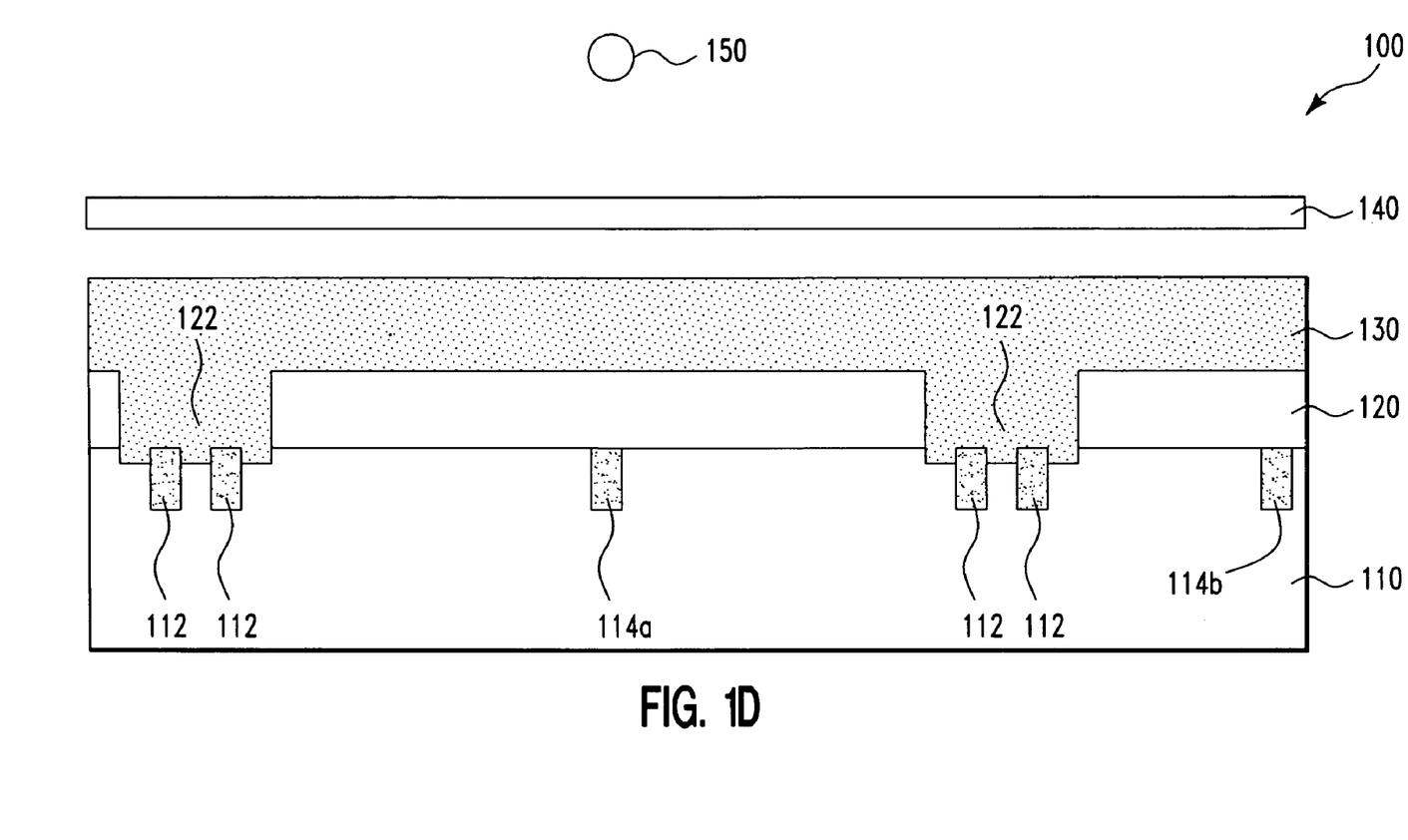
FIG. 1D shows a cross-section view of a semiconductor structure resulting from forming a photoresist layer on the structure of FIG. 1C, in accordance with embodiments of the present invention.

Next, with reference to FIG. 1D, in one embodiment, a photoresist layer 130 is formed on top of the structure 100 of FIG. 1C such that the photoresist layer 130 completely fills the trenches 122. The photoresist layer 130 can be formed by a conventional spin-on process.

Figure 1E:
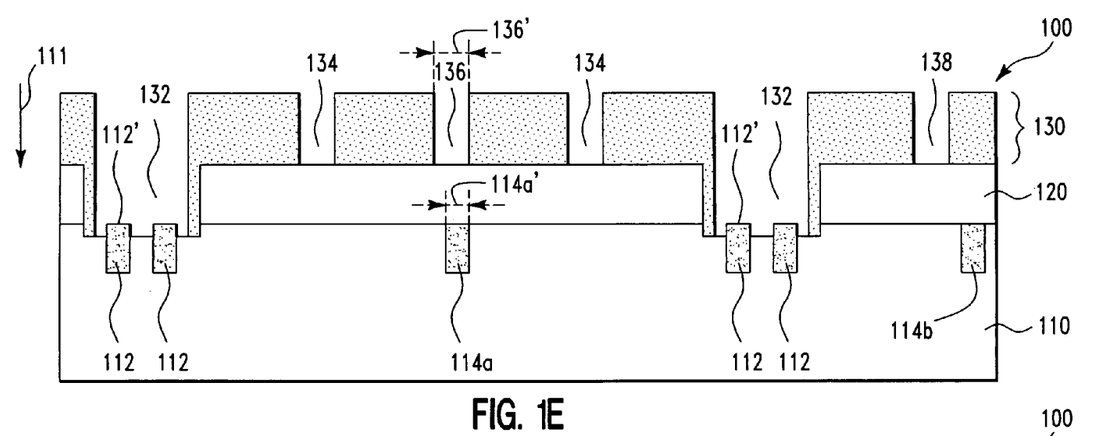
FIG. 1E shows a cross-section view of a semiconductor structure resulting from forming holes in the photoresist layer of the structure of FIG. 1D, in accordance with embodiments of the present invention.

Next, in one embodiment, the photoresist layer 130 is patterned resulting in holes 132, 134, 136, and 138 in the photoresist layer 130 of FIG. 1E. With reference to FIG. 1E, the top surfaces 112' of the alignment mark regions 112 are exposed to the surrounding ambient through the holes 132. In one embodiment, the width 136' of the hole 136 is different from the width 114a' of the dielectric region 114a. For example, the width 136' is greater than the width 114a'.

In one embodiment, the photoresist layer 130 is patterned as follows. The semiconductor structure 100 of FIG. 1D is exposed to light of a first wavelength to align a reticle 140 that contains the patterns to be transferred to the photoresist layer 130. The first wavelength is selected such that the light of the first wavelength is transparent to the photoresist layer 130 but is appropriately reflected by the alignment mark regions 112. As a result, the reticle 140 can be aligned to the alignment mark regions 112 of FIG. 1D. Next, in one embodiment, after the alignment of the reticle 140 to the alignment mark regions 112 is performed, the exposure process of the photoresist layer 130 is performed. More specifically, the photoresist layer 130 is exposed to light of a second wavelength from the light source 150 through the reticle 140. Finally, in one embodiment, after the exposure process is performed, the photoresist layer 130 is developed resulting in the holes 132, 134, 136, and 138 in the photoresist layer 130 of FIG. 1E.

Figure 1F:
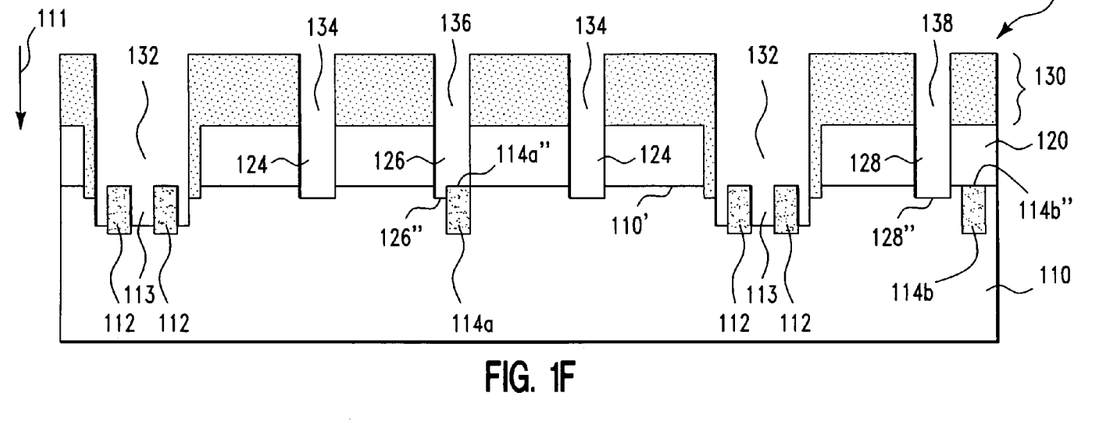
FIG. 1F shows a cross-section view of a semiconductor structure resulting from creating trenches in the structure of FIG. 1E, in accordance with embodiments of the present invention.

Next, in one embodiment, the semiconductor layer 120 is etched with the patterned photoresist layer 130 as a blocking mask resulting in trenches 124, 126, and 128 in the semiconductor layer 120 and the substrate 110, as shown in FIG. 1F, such that the top surface 114a" of the dielectric region 114a is exposed to the surrounding ambient through the trench 126 and the hole 136. It should be noted that the substrate 110 is also etched resulting in the trenches 113 in the substrate 110 as shown in FIG. 1F. With reference to FIG. 1F, the dielectric region 114b remains being buried in the semiconductor layer 120 and the substrate 110 (i.e., the dielectric region 114b is surrounded by the semiconductor material of the layers 120 and 110 such as silicon). In one embodiment, the etching of the semiconductor layer 120 is performed such that the bottom surfaces 126" and 128" of the trenches 126 and 128, respectively, are at lower levels than the top surface 110' of the substrate 110 (i.e., at lower levels than the top surfaces 114a" and 114b" of the dielectric regions 114a and 114b, respectively) in the direction 111. The etching of the semiconductor layer 120 can be performed in the direction 111 using the photoresist layer 130 as a blocking mask.

Figure 1G:
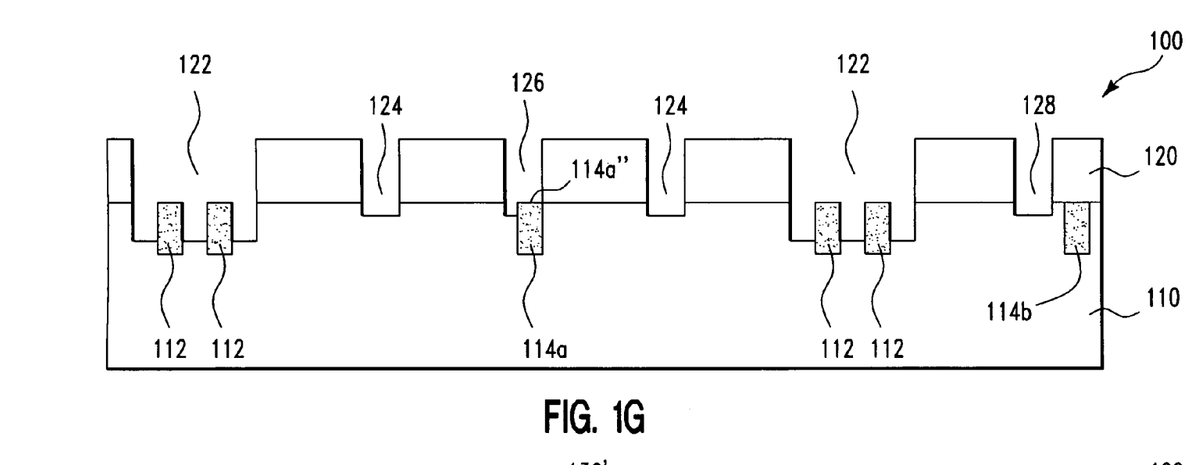
FIG. 1G shows a cross-section view of a semiconductor structure resulting from removing the photoresist layer of the structure of FIG. 1F, in accordance with embodiments of the present invention.

Next, in one embodiment, the photoresist layer 130 is removed resulting in the semiconductor structure 100 of FIG. 1G. The photoresist layer 130 can be removed by a conventional wet etching process.

Figure 1H:
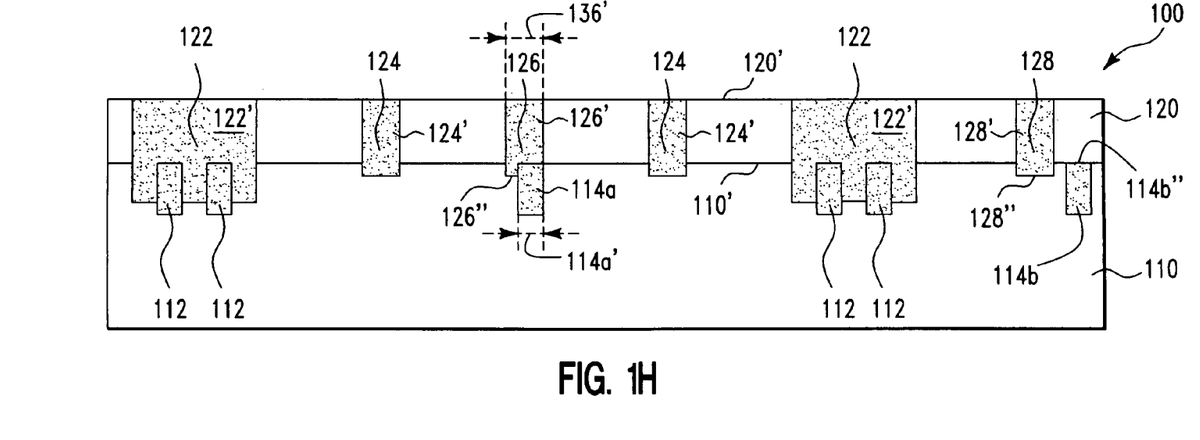
FIG. 1H shows a cross-section view of a semiconductor structure resulting from forming dielectric regions on the structure of FIG. 1G, in accordance with embodiments of the present invention.

Next, with reference to FIG. 1H, in one embodiment, dielectric regions 122', 124', 126', and 128' are formed in the trenches 122, 124, 126, and 128, respectively. The dielectric regions 122', 124', 126', and 128' can comprise silicon dioxide. If silicon dioxide is used, the dielectric regions 122', 124', 126', and 128' can be formed by (i) depositing a silicon dioxide layer (not shown) on top of the semiconductor structure 100 of FIG. 1G such that the trenches 122, 124, 126, and 128 are filled with silicon dioxide and then (ii) removing silicon dioxide outside the trenches 122, 124, 126, and 128 resulting in the dielectric regions 122' 124', 126', and 128' of FIG. H. More specifically, this deposited silicon dioxide layer can be formed by CVD (Chemical Vapor Deposition) of silicon dioxide on top of the semiconductor structure 100 of FIG. 1G. Then, a CMP (Chemical Mechanical Polishing) process is performed on top of this silicon dioxide layer until the top surface 120' of the semiconductor layer 120 is exposed to the surrounding ambient resulting in the dielectric regions 122' 124', 126', and 128' of FIG. 1H.

It should be noted that the bottom surfaces 126" and 128" of the dielectric regions 126' and 128', respectively, are at lower levels than the top surface 110' of the substrate 110 in the direction 111.

It should be noted that, as shown in FIG. 1G, the top surface 114a" of the dielectric region 114a is exposed to the surrounding ambient through the trench 126. Therefore, as a result of the filling of the trench 126 with the dielectric region 126', the dielectric region 114a is in direct physical contact with the dielectric region 126'. The dielectric region 114a and the dielectric region 126' constitute a deep trench isolation region 114a+126'. The deep trench isolation region 114a+126' has a top portion 126' and a bottom portion 114a. In the example described above, the width 136' of the top portion 126' is greater than the width 114a' of the bottom portion 114a.

Figure 1I:
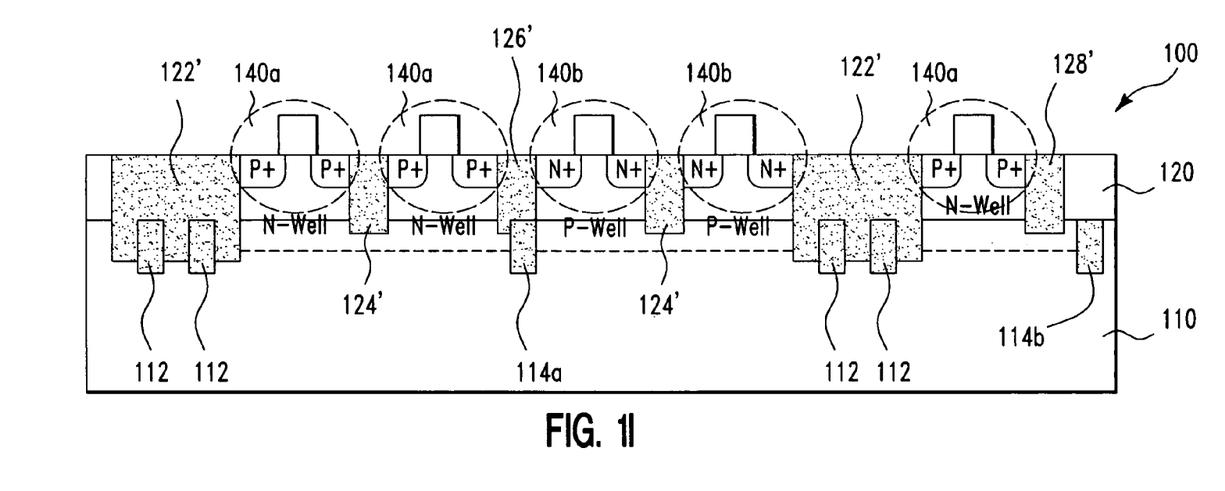
FIG. 1I shows a cross-section view of a semiconductor structure resulting from forming PFETs and NFETs on the structure of FIG. 1H, in accordance with embodiments of the present invention.

Next, in one embodiment, with reference to FIG. 1I, N-well regions and P-well regions are formed in the semiconductor substrate 110+120. The N-well regions and P-well regions can be formed by conventional ion implantation processes. Next, PFETs (P-channel Field Effect Transistors) 140a are formed in the N-well regions and NFETs (N-channel FETs) 140b are formed in the P-well regions. The PFETs 140a are electrically isolated from one another by the dielectric region 124' (the left one). Similarly, the NFETs 140b are also electrically isolated from one another by the dielectric region 124' (the right one). The dielectric regions 124' hereafter can be called STI (Shallow Trench Isolation) regions 124'. The PFETs 140a are electrically isolated from the NFETs 140b by the deep trench isolation region 114a+126'. The PFETs 140a and NFETs 140b can be formed by conventional processes.

In summary, with reference to FIG. 1F, the trenches 124, 126, and 128 are created such that the dielectric region 114a is exposed to the surrounding ambient through the trench 126. This requires that the hole 136 created in the photoresist layer 130 overlaps the dielectric region 114a in the direction 111. A first region is said to overlap a second region in a reference direction if and only if there exits at least one point inside the first region such that a straight line going through that point and being parallel to the reference direction would intersect the second region. The creation of the hole 136 which overlaps the dielectric region 114a in the direction 111 is performed by the use of the alignment mark regions 112 as described above. Later, after the trenches 124, 126, and 128 are created, the trenches 124, 126, and 128 are filled with a dielectric material resulting in STI regions 124 and 128 and the deep trench isolation region 114a+126', as shown in FIG. 1H. It should be noted that the width 136' of the top portion 126' of the deep trench isolation region 114a+126' is greater than the width 114a' of the bottom portion 114a of the deep trench isolation region 114a+126'.

In the embodiments described above, with reference to FIG. 1E, the photoresist layer 130 is patterned such that the top surfaces 112' of the alignment mark regions 112 are exposed to the surrounding ambient through the holes 132. Alternatively, the photoresist layer 130 is patterned as described above except that the holes 132 are not created.

Figure 2A:
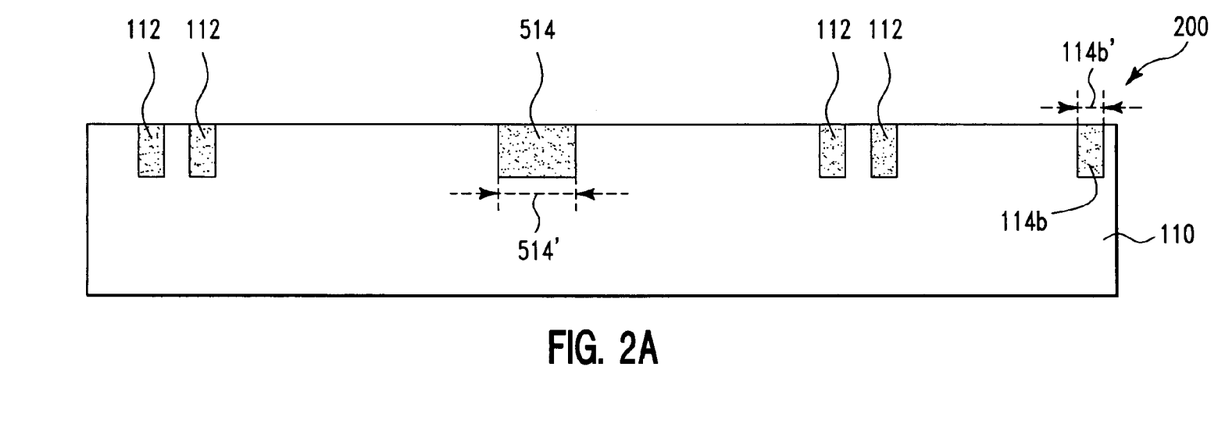
FIG. 2A shows a cross-section view of a fabrication process of another semiconductor structure, in accordance with embodiments of the present invention.
Figure 2B:
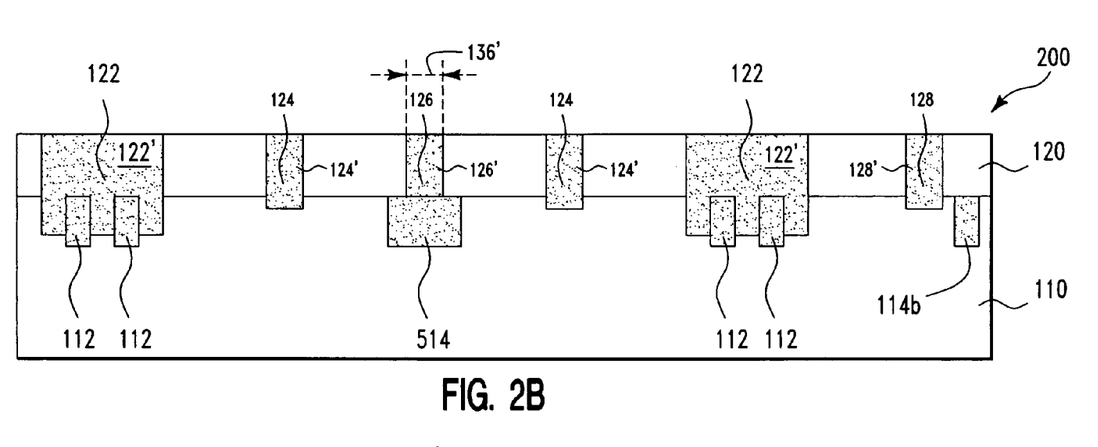
FIG. 2B shows a cross-section view of a semiconductor structure resulting from forming dielectric regions on the structure of FIG. 2A, in accordance with embodiments of the present invention.
Figure 2C:
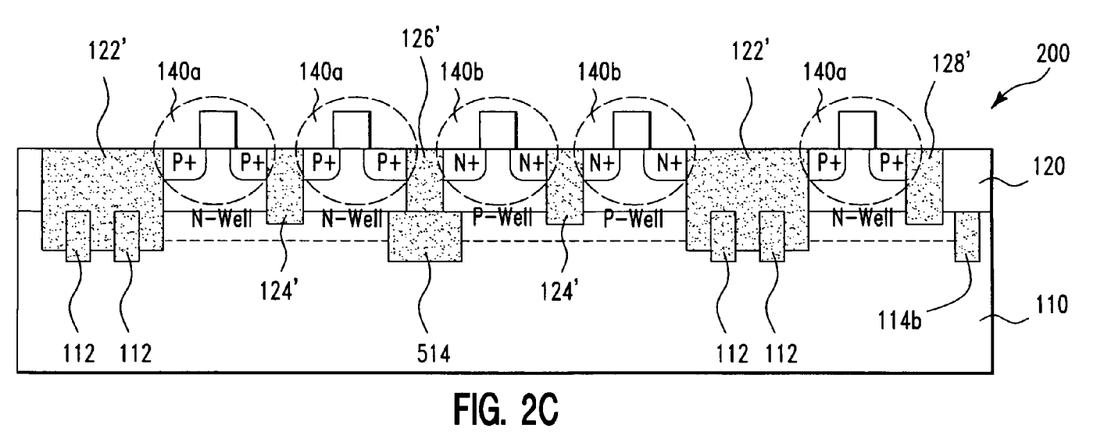
FIG. 2C shows a cross-section view of a semiconductor structure resulting from forming PFETs and NFETs on the structure of FIG. 2B, in accordance with embodiments of the present invention.

FIGS. 2A-2C show cross-section views that illustrate a fabrication process of a semiconductor structure 200, in accordance with embodiments of the present invention. More specifically, with reference to FIG. 2A, the fabrication process can start with the semiconductor structure 200 of FIG. 2A. The semiconductor structure 200 is similar to the semiconductor structure 100 of FIG. 1A except that the width 514' of the dielectric region 514 is greater than the width 114a' of the dielectric region 114a of FIG. 1A. The formation of the semiconductor structure 200 of FIG. 2A is similar to the formation of the semiconductor structure 100 of FIG. 1A.

Next, with reference to FIG. 2B, in one embodiment, the semiconductor layer 120 is formed on top of the substrate 110 and then the STI regions 122', 124', 126', and 128' are formed in the semiconductor layer 120 and the substrate 110. The STI regions 122', 124', 126', and 128' can comprise silicon dioxide. In one embodiment, the width 514' of the dielectric region 514 is greater than the width 136' of the STI region 126'. The semiconductor layer 120 and the STI regions 122', 124', 126', and 128' can be formed in a manner similar to the manner in which the semiconductor layer 120 and the STI regions 122', 124', 126', and 128' (FIG. 1H) are formed on the semiconductor structure 100 of FIG. 1A.

It should be noted that the dielectric region 514 and the dielectric region 126' constitute a deep trench isolation region 514+126'. The deep trench isolation region 514+126' has a top portion 126' and a bottom portion 514. In the example described above, the width 136' of the top portion 126' is smaller than the width 514' of the bottom portion 514.

Next, with reference to FIG. 2C, N-well regions and P-well regions are formed in the semiconductor substrate 110+120. The N-well regions and P-well regions can be formed by conventional ion implantation processes. Next, PFETs (P-channel Field Effect Transistors) 140a are formed in the N-well regions and NFETs (N-channel FETs) 140b are formed in the P-well regions. The PFETs 140a are electrically isolated from one another by the STI region 124' (the left one). Similarly, the NFETs 140b are also electrically isolated from one another by the STI region 124' (the right one). The PFETs 140a are electrically isolated from the NFETs 140b by the deep trench isolation region 514+126'. The PFETs 140a and NFETs 140b can be formed by conventional processes.

In summary, with reference to FIG. 2C, the deep trench isolation region 514+126' is formed by separately forming the dielectric region 514 and the dielectric region 126'. The dielectric region 514 is formed in the substrate 110, whereas the dielectric region 126' is formed in the semiconductor layer 120. The width 136' of the top portion 126' is smaller than the width 514' of the bottom portion 514.

In one embodiment, with reference to FIG. 1A, the alignment mark regions 112 are formed in the dicing channels of the wafer such that after chips (integrated circuits) are formed on the wafer, the wafer can be cut along the dicing channels into separate chips While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
   providing a semiconductor structure which includes a first semiconductor layer and a dielectric bottom portion in the first semiconductor layer, wherein the first semiconductor layer consists of a semiconductor material;
   forming a second semiconductor layer on and in direct physical contact with the first semiconductor layer, wherein the second semiconductor layer consists of the semiconductor material;
   after said forming the second semiconductor layer is performed, forming a dielectric top portion and a first STI (Shallow Trench Isolation) region in the second semiconductor layer, wherein the dielectric top portion is in direct physical contact with the dielectric bottom portion, and wherein a portion of said second semiconductor layer is located between the first STI region and the dielectric top portion such that said portion of the second semiconductor layer separates the first STI region from the dielectric top portion; and
   forming a structure consisting of a first alignment mark region, a second alignment mark region, and a dielectric region surrounding a portion of said first alignment mark region and a portion of said second alignment mark region, wherein said first alignment mark region, said second alignment mark region, and said dielectric region each comprise a dielectric material, wherein said first alignment mark region and said second alignment mark region are formed within said first semiconductor layer such that a top surface of said first alignment mark region and a top surface of said second alignment mark region are each formed coplaner to a top surface of said first semiconductor layer, and wherein said dielectric region is formed within said first semiconductor layer and said second semiconductor layer.

2. The method of claim 1, wherein said forming the second semiconductor layer is implemented using a Smart-Cut® process.

3. The method of claim 1,
   wherein the semiconductor structure further includes an alignment mark region in the first semiconductor layer, and
   wherein said forming the dielectric top portion and the first STI region comprises:
      removing a portion of the second semiconductor layer resulting in a top surface of the dielectric bottom portion being exposed to a surrounding ambient through the removed portion;
      forming a photoresist layer on top of and in mechanical contact with the second semiconductor layer;
      aligning a reticle to the alignment mark region;
      transferring a pattern of the reticle to the photoresist layer resulting in a first trench and a second trench; and
      filling the first and second trenches with a dielectric material resulting in the dielectric top portion and the STI region, respectively.

4. The method of claim 3, wherein the alignment mark region comprises silicon dioxide.

5. The method of claim 3, wherein the alignment mark region is in a dicing channel.

6. The method of claim 3, wherein said alignment mark region comprises a first alignment mark region formed adjacent to a second alignment mark region, and wherein said method further comprises:
   forming a second STI region over and surrounding said first alignment mark region and said second alignment mark region.

7. The method of claim 6, wherein a top surface of said first semiconductor layer is coplaner with a top surface of said first alignment mark region and a top surface of said second alignment mark region.

8. The method of claim 1, wherein the dielectric bottom portion and the dielectric top portion comprise silicon dioxide.

9. The method of claim 1, further comprising forming a first PFET (P-channel field effect transistor) and a second PFET,
wherein the first STI region electrically isolates the first PFET from the second PFET.

10. The method of claim 1, further comprising forming a second STI region in the second semiconductor layer,
wherein said forming the dielectric top portion and the first STI region and said forming the second STI region are performed simultaneously.

11. The method of claim 10, further comprising forming a third NFET (N-channel FET) and a fourth NFET,
wherein the second STI region electrically isolates the third NFET from the fourth NFET, and
wherein the dielectric top portion and the dielectric bottom portion together electrically isolate the first and second PFETs from the third and fourth NFETs.

12. The method of claim 1,
wherein the semiconductor structure further includes a buried isolated dielectric region,
wherein the buried isolated dielectric region is completely surrounded by the first and second semiconductor layers.

13. The method of claim 1, wherein a bottom width of the dielectric bottom portion is greater than a top width of the dielectric top portion.

14. The method of claim 1, wherein a bottom width of the dielectric bottom portion is smaller than a top width of the dielectric top portion.

15. The method of claim 1, wherein the dielectric bottom portion does not extend into the second semiconductor layer.

16. The method of claim 1, wherein sad STI region extends through said second semiconductor layer and into said first semiconductor layer, wherein said dielectric bottom portion comprises a first horizontal side and a second horizontal side, wherein said dielectric top portion comprises a third horizontal side and a fourth horizontal side, wherein said first horizontal side is coplaner with said third horizontal side, wherein said second horizontal side is non-coplaner with said fourth horizontal side, wherein said dielectric top portion is in direct physical contact with only two sides of said dielectric bottom portion, and wherein a portion of said dielectric region is formed between said first alignment mark region and said second alignment mark region.

17. A semiconductor structure fabrication method, comprising:
providing a semiconductor structure which includes a first semiconductor layer, a second semiconductor layer on and in direct physical contact with the first semiconductor layer, and a dielectric bottom portion buried in the first semiconductor layer, wherein the first semiconductor layer consists of a semiconductor material, and wherein the second semiconductor layer consists of the semiconductor material;

after said providing the semiconductor structure is performed, forming a dielectric top portion and a first STI (Shallow Trench Isolation) region in the second semiconductor layer, wherein the dielectric top portion is in direct physical contact with the dielectric bottom portion, and wherein a portion of said second semiconductor layer is located between the first STI region and the dielectric top portion such that said portion of the second semiconductor layer separates the first STI region from the dielectric top portion; and forming a structure consisting of a first alignment mark region, a second alignment mark region, and a dielectric region surrounding a portion of said first alignment mark region and a portion of said second alignment mark region, wherein said first alignment mark region, said second alignment mark region, and said dielectric region each comprise a dielectric material, wherein said first alignment mark region and said second alignment mark region are formed within said first semiconductor layer such that a top surface of said first alignment mark region and a top surface of said second alignment mark region are each formed coplaner to a top surface of said first semiconductor layer, and wherein said dielectric region is formed within said first semiconductor layer and said second semiconductor layer.

18. The method of claim 17,
wherein the semiconductor structure further includes an alignment mark region in the first semiconductor layer, and
wherein said forming the dielectric top portion and the first STI region comprises:
removing a portion of the second semiconductor layer resulting in a top surface of the dielectric boffom portion being exposed to a surrounding ambient through the removed portion;
forming a photoresist layer on top of and in mechanical contact with the second semiconductor layer;
aligning a reticle to the alignment mark region;
transferring a pattern of the reticle to the photoresist layer resulting in a first trench and a second trench; and
filling the first and second trenches with a dielectric material resulting in the dielectric top portion and the STI region, respectively.

19. The method of claim 17, further comprising forming a second STI region in the second semiconductor layer,
wherein said forming the dielectric top portion and the first STI region and said forming the second STI region are performed simultaneously.

20. The method of claim 19, further comprising forming a third NFET (N-channel FET) and a fourth NFET,
wherein the second STI region electrically isolates the third NFET from the fourth NFET, and
wherein the dielectric top portion and the dielectric bottom portion together electrically isolate the first and second PFETs from the third and fourth NFETs.

* * * * *